US009159420B1

(12) United States Patent
Wohlgemuth

(10) Patent No.: US 9,159,420 B1
(45) Date of Patent: Oct. 13, 2015

(54) METHOD AND APPARATUS FOR CONTENT ADDRESSABLE MEMORY PARALLEL LOOKUP

(75) Inventor: Aron Wohlgemuth, Givat Shmuel (IL)

(73) Assignee: MARVELL ISRAEL (M.I.S.L) LTD., Yokneam (IL)

( * ) Notice: Subject to any disclaimer, the term of this patent is extended or adjusted under 35 U.S.C. 154(b) by 359 days.

(21) Appl. No.: 13/584,864

(22) Filed: Aug. 14, 2012

Related U.S. Application Data

(60) Provisional application No. 61/524,257, filed on Aug. 16, 2011.

(51) Int. Cl.
G11C 15/00 (2006.01)
G11C 15/04 (2006.01)

(52) U.S. Cl.
CPC ............... G11C 15/00 (2013.01); G11C 15/04 (2013.01)

(58) Field of Classification Search
None
See application file for complete search history.

(56) References Cited

U.S. PATENT DOCUMENTS

| 3,075,178 | A | * | 1/1963 | James | 369/14 |
| 5,680,536 | A | * | 10/1997 | Tyuluman | 714/1 |
| 6,353,873 | B1 | * | 3/2002 | Melchior | 711/108 |
| 6,374,326 | B1 | * | 4/2002 | Kansal et al. | 711/108 |
| 6,862,281 | B1 | * | 3/2005 | Chandrasekaran | 711/108 |
| 6,987,683 | B2 | * | 1/2006 | Ao | 365/49.18 |
| 7,249,228 | B1 | * | 7/2007 | Agarwal et al. | 711/154 |
| 2001/0002790 | A1 | * | 6/2001 | Meli | 324/158.1 |
| 2002/0146009 | A1 | * | 10/2002 | Gupta et al. | 370/392 |
| 2003/0093613 | A1 | * | 5/2003 | Sherman | 711/104 |
| 2003/0179623 | A1 | * | 9/2003 | Inoue | 365/200 |
| 2004/0085834 | A1 | * | 5/2004 | Matsumoto et al. | 365/200 |
| 2004/0143701 | A1 | * | 7/2004 | Giambalvo | 711/108 |
| 2004/0205292 | A1 | * | 10/2004 | Lu | 711/108 |
| 2006/0056633 | A1 | * | 3/2006 | Hsu | 726/4 |
| 2006/0059196 | A1 | * | 3/2006 | Sato et al. | 707/104.1 |
| 2007/0174537 | A1 | * | 7/2007 | Kao et al. | 711/108 |
| 2008/0259667 | A1 | * | 10/2008 | Wickeraad | 365/49.1 |
| 2009/0240875 | A1 | * | 9/2009 | Chu et al. | 711/108 |
| 2011/0299317 | A1 | * | 12/2011 | Shaeffer et al. | 365/106 |
| 2011/0307656 | A1 | * | 12/2011 | Hamdi et al. | 711/108 |
| 2012/0204183 | A1 | * | 8/2012 | Bayer et al. | 718/102 |
| 2013/0036274 | A1 | * | 2/2013 | Bouchard et al. | 711/149 |

* cited by examiner

Primary Examiner — Cheng-Yuan Tseng
Assistant Examiner — Craig Goldschmidt

(57) ABSTRACT

Systems and methods are provided for a content addressable memory. A system includes a common memory module configured to store a plurality of entries, ones of the entries being defined by a string of bits. A first parallel compare logic unit is configured to compare a first lookup key against a plurality of entries stored in the memory module in a first memory operation cycle and to output a match indication indicating a match between the first lookup key and the string of bits of an entry from among the plurality of entries. A second parallel compare logic unit is configured to compare, in the first memory operation cycle, a second lookup key against the plurality of entries stored in the memory module and to output a match indication indicating a match between the second lookup key and the string of bits of an entry from among the plurality of entries.

21 Claims, 9 Drawing Sheets

METHOD AND APPARATUS FOR CONTENT ADDRESSABLE MEMORY PARALLEL LOOKUP

CROSS-REFERENCE TO RELATED APPLICATIONS

This application claims priority to U.S. Provisional Patent Application No. 61/524,257, filed Aug. 16, 2011, entitled "TCAM Parallel Lookup," which is herein incorporated in its entirety.

FIELD

The technology described herein relates generally to content addressable memories and more particular to parallel access to content addressable memories.

BACKGROUND

A typical memory, such as a random access memory (RAM), accepts an address as an input and, in response, outputs one or more data values corresponding to that address as an output. A content addressable memory (CAM) operates in a different manner, where the content addressable memory receives a data value as an input and outputs an indication of whether that data value is present at any address in the content addressable memory.

The description above is presented as a general overview of related art in this field and should not be construed as an admission that any of the information it contains constitutes prior art against the present patent application.

SUMMARY

Examples of systems and methods are provided for a content addressable memory. In one embodiment of the disclosure, a content addressable memory includes a common memory module configured to store a plurality of entries, ones of the entries being defined by a string of bits. A first parallel compare logic unit is configured to compare a first lookup key against a plurality of entries stored in the memory module in a first memory operation cycle and to output a match indication indicating a match between the first lookup key and the string of bits of an entry from among the plurality of entries matching the look up key. A second parallel compare logic unit is configured to compare, in the first memory operation cycle, a second lookup key against the plurality of entries stored in the memory module, and to output a match indication indicating a match between the second lookup key and the string of bits of an entry from among the plurality of entries matching the second look up key.

In another embodiment of the disclosure, a method of simultaneously comparing multiple lookup keys with multiple stored key memory entries includes receiving a first lookup key, comparing the first lookup key against a plurality of entries stored in a common memory module in a first operation cycle, and outputting a first match indication indicating a match between the first lookup key and one of the entries. The method further includes receiving multiple lookup keys, comparing the multiple lookup keys against the plurality of entries stored in the common memory module in the first operation cycle in parallel with the comparing of the first lookup key, and outputting a second match indication indicating a match between the second lookup key and one of the entries.

In a further embodiment of the disclosure, a computer network device includes a receiver configured to receive a first packet of data associated with a first network address and a second packet of data associated with the second network address. A key generator is configured to generate a first lookup key based on the first network address and to generate a second lookup key based on the second network address. A common stored key memory module is configured to store a plurality of entries. A first parallel compare logic unit is configured to compare a first lookup key associated with the first network address against a plurality of entries stored in the memory module in a first memory operation cycle and to output a match indication indicating a match between the first lookup key and the string of bits of an entry from among the plurality of entries, and a second parallel compare logic unit is configured to compare, in the first memory operation cycle, a second lookup key associated with the second network address against the plurality of entries stored in the memory module and to output a match indication indicating a match between the second lookup key and the string of bits of an entry from among the plurality of entries.

DETAILED DESCRIPTION

Figure 1:
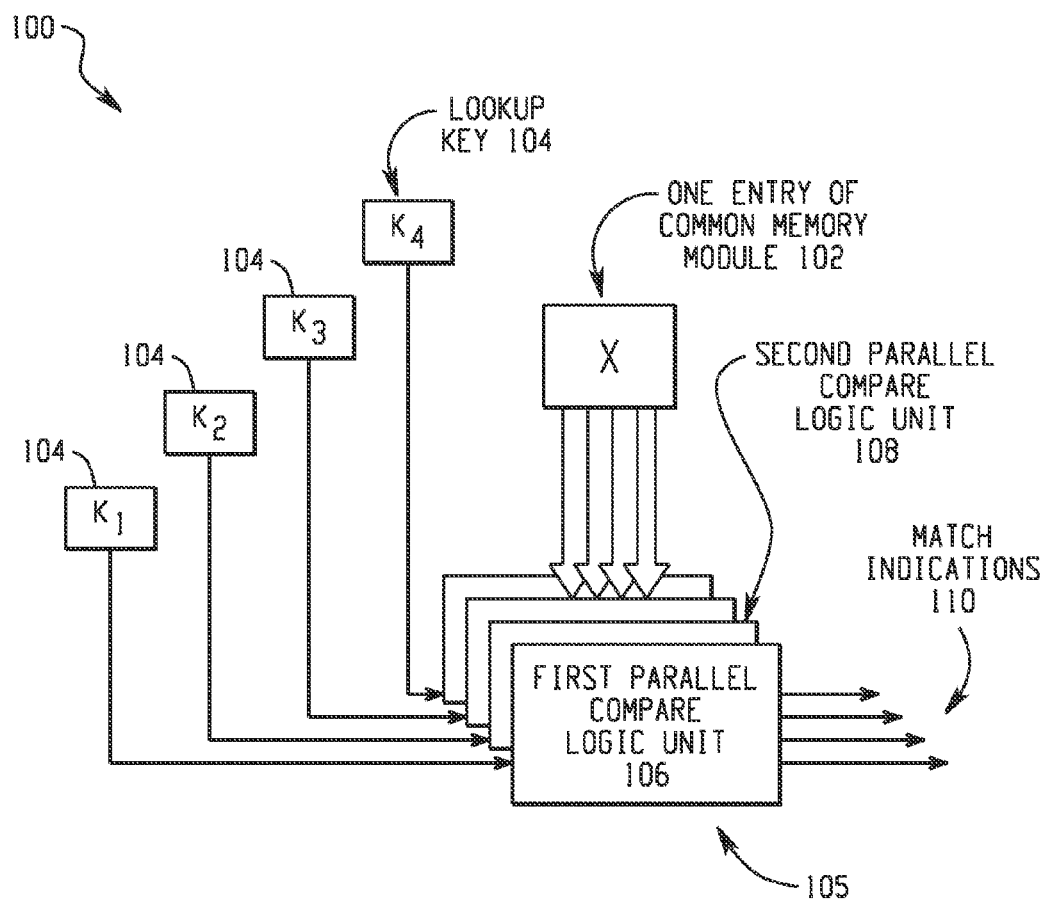
FIG. 1 is a simplified block diagram depicting a content addressable memory in accordance with an embodiment of the disclosure.

FIG. 1 is a simplified block diagram depicting a content addressable memory 100 in accordance with an embodiment of the disclosure. The content addressable memory 100 includes an entry 102 of a common memory module. The entry 102 includes a string of bits. When the content addressable memory 100 receives a lookup key 104, such as lookup key $K_1$, the lookup key 104 is compared to the entry 102 of the common memory module to determine if the lookup key 104 matches the entry 102 of the common memory module.

In accordance with an embodiment, the content addressable memory 100 includes multiple instances of parallel compare logic units 105, including at least first and second parallel compare logic units 106 and 108 for a given entry 102 of the common memory model. The multiple parallel compare logic units 105 provide for parallel comparisons to be performed between the entry 102 of the common memory module and multiple lookup keys 104 at the same time. For example, a first parallel compare logic unit 106 compares the entry 102 to a first received lookup key, $K_1$, during a first memory operation cycle. The first parallel compare logic unit 106 outputs a result of that comparison in the form of a match indication 110 during the first memory operation cycle. Match indications can take a variety of forms, examples of which are discussed herein below.

In accordance with an embodiment of the disclosure, when a second lookup key, $K_2$, is received by the content addressable memory 100 at or near the same time that the first lookup key, $K_1$, is received, the second lookup key, $K_2$, is provided to a second parallel compare logic unit 108. The second parallel compare logic unit 108 compares the entry 102 to the second lookup key, $K_2$, and outputs a match indication 110 for the second lookup key, $K_2$, during the first memory operation cycle. In an embodiment, the respective match indication 110 for the first lookup key $K_1$ is separate from and not dependent on the match indication 110 for the second lookup key $K_2$.

The configuration depicted in FIG. 1 enables cost effective expansion of the content addressable memory to increase its performance capabilities. The entry 102 of the common memory module, which in one specific example requires N transistors per bit to implement, is implemented only once and shared across the multiple parallel compare logic units 106, 108, where each of the parallel compare logic units 106, 108 requires M transistors per bit to implement. Other example implementations may require a greater or lesser number of transistors. Thus, in an embodiment, parallel pathways for simultaneously comparing different lookup keys 104 in parallel against the same set of entries in a common memory during a single memory operation cycle can be implemented merely at the cost of one parallel compare logic unit block for each comparison. Thus, an additional parallel pathway for comparing a received lookup key 104 bit to a bit of the entry 102 can be implemented at the cost of M transistors, where such an expansion would cost M+N transistors were the bit of the entry not provided to the multiple parallel compare logic units 106, 108. Such a configuration enables expansion to any number of parallel compare logic units 106, 108, expanding content addressable memory throughput capabilities and reduction of bottlenecks, at a comparatively low cost.

Figure 2:
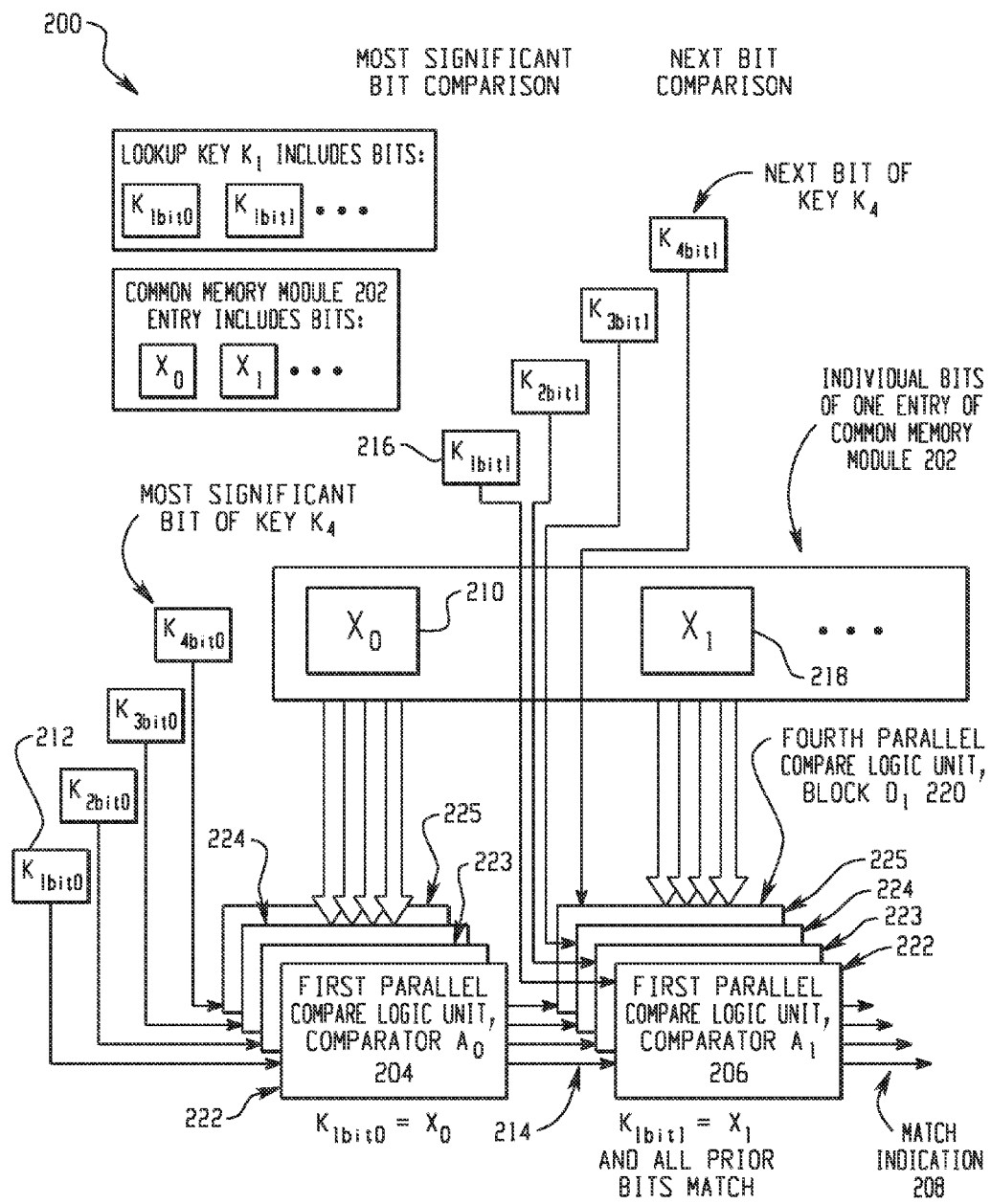
FIG. 2 is a block diagram depicting further details of the content addressable memory of FIG. 1 in one embodiment.

FIG. 2 is a block diagram depicting further details of the content addressable memory 200 of FIG. 1 in accordance with an embodiment. The diagram of FIG. 2 illustrates a bit-wise comparison between the respective received lookup keys, $K_1$, $K_2$, $K_3$, $K_4$, and the entry of the common memory module 202. In the embodiment of FIG. 2, each of the parallel compare logic units, A 222, B 223, C 224, and D 225, includes a plurality of bit comparators. For example, the first parallel compare logic unit, A 222, includes a first comparator $A_0$ 204 and a second comparator $A_1$ 206. Each comparator determines whether a specific bit of a received lookup key matches a specific bit of the entry 202. When all of the bits of the lookup key match all of the bits of the entry 202, a match indication 208 is output.

In the embodiment of FIG. 2, the comparison is accomplished via a cascading implementation of the bit comparators 204, 206. When the $K_1$ lookup key is received, a first bit 212 of the $K_1$ lookup key is provided to the first bit comparator 204 of the first parallel compare logic unit, A. The first bit comparator 204 compares the first bit, $X_0$ 210, of the entry 202 with the first bit 212 of the $K_1$ lookup key, that is whether $K_{1bit0}=X_0$, and outputs a bit match indication for that bit at 214. In one example, the first bit comparator 204 outputs a 1, indicating a logical true, when $K_{1bit0}=X_0$ is true and a 0 otherwise. The second bit comparator 206 compares the second bit 216 of the $K_1$ lookup key with the second bit, $X_1$ 218, of the entry 202. The second bit comparator 206 outputs an indication of a match at 208 when $K_{1bit1}=X_1$ and when the match indication 214 from the first bit comparator 204 indicates that the first bits 210, 212 also match. If the entry 202 and lookup keys comprise more than two bits, then the match indication output at 208 is provided to further bit comparators. If the entry 202 consists of only two bits, then the match indication 208 indicates whether all of the bits of the entry 202 match all of the bits of the lookup key, $K_1$.

Other embodiments for bitwise comparisons may also be implemented. For example, comparisons associated with each of the bits of the entry of the common memory module 202 may be performed in parallel, with the resulting bit match indications being analyzed simultaneously, such as through use of an "AND" gate, to determine a match indication for all of the bits of the entry 202.

The content addressable memory 200 includes additional layers of parallel compare logic units, so that bitwise comparisons can be performed for multiple lookup keys, $K_1$, $K_2$, $K_3$, $K_4$, during a same memory operational cycle. In one embodiment, a same memory operation cycle includes one or more clock cycles that overlap among operations performed on the multiple lookup keys. In the example of FIG. 2, the content addressable memory includes four parallel compare logic units, A 222, B 223, C 224, and D 225, each of which includes multiple bit comparators, such as the second bit comparator of the fourth parallel compare logic unit, D 225, indicated at $D_1$ 220.

Figure 3:
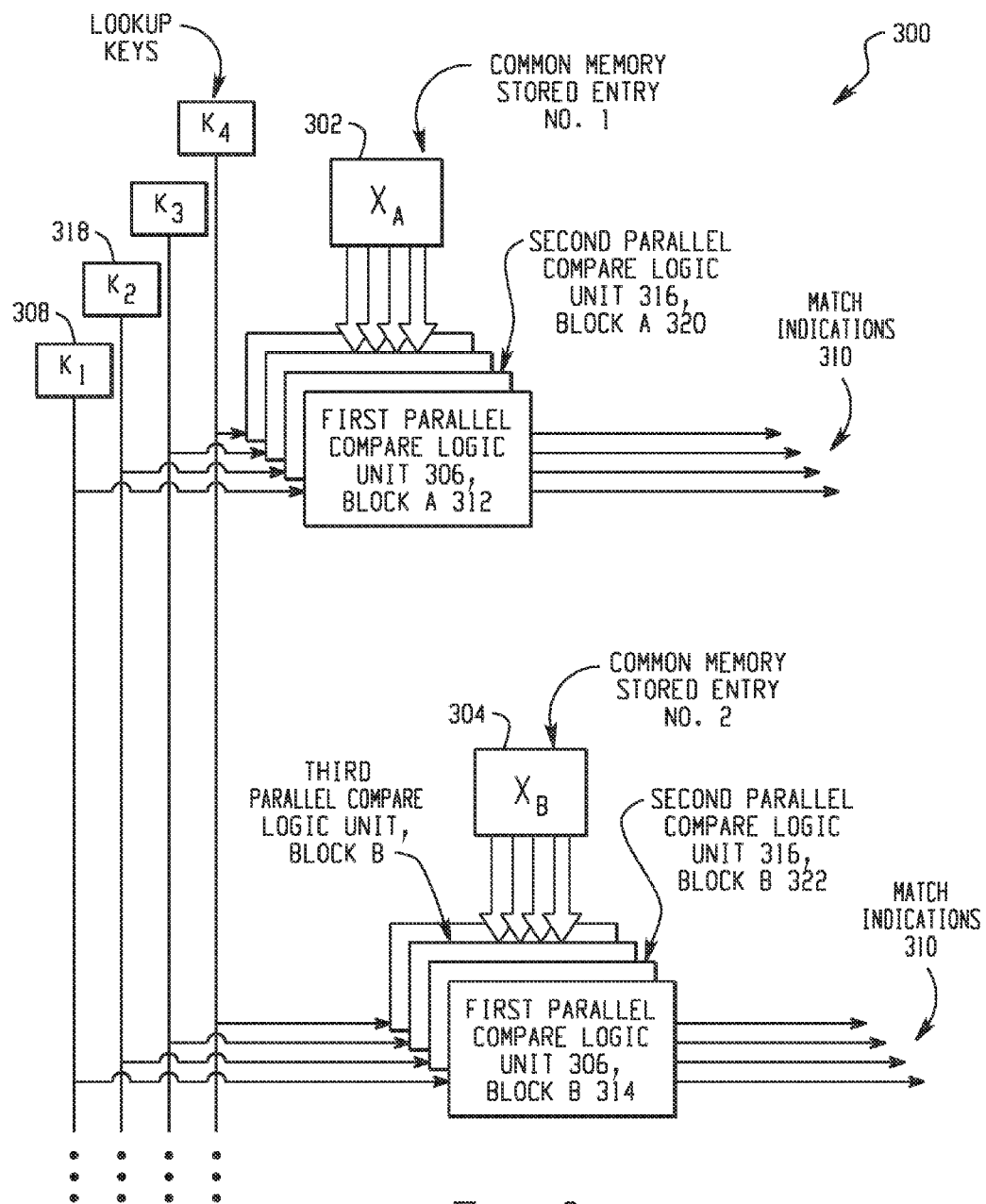
FIG. 3 is a block diagram depicting a content-addressable memory that includes multiple entries.

FIG. 3 is a block diagram depicting a content-addressable memory that includes multiple entries in accordance with an embodiment. The content addressable memory 300 includes a common memory module configured to store a plurality of entries 302, 304. Each of the entries 302, 304 is defined by a string of bits. A first parallel compare logic unit 306 is configured to compare a first lookup key, $K_1$ 308, against each of the plurality of entries 302, 304 stored in the common memory module. The comparison between the first lookup key, $K_1$ 308, and the plurality of entries is performed in parallel in a first memory operation cycle. The first parallel compare logic unit 306 outputs a match indication 310 for each entry 302, 304 indicating a match between the first lookup key, $K_1$ 308 and the string of bits of that entry 302, 304.

In the embodiment of FIG. 3, a first block, block A 312, of the first parallel compare logic unit 306 compares the first lookup key, $K_1$ 308, to the first entry 302 of the common memory module during a first memory operation cycle. In that same first memory operation cycle, a second block, block B 314, of the first parallel compare logic unit 306 compares the first lookup key, $K_1$ 308, to the second entry 304 of the common memory module.

The content addressable memory 300 further includes a second parallel compare logic unit 316 that is configured to compare a second lookup key, $K_2$ 318, against the plurality of entries 302, 304 stored in the common memory module in parallel in the first memory operation cycle. The second parallel compare logic unit 316 outputs a match indication 310 for each entry 302, 304 indicating a match between the second lookup key, $K_2$ 318, and the string of bits of that entry 302, 304 in the common memory. Specifically, in the embodiment of FIG. 3, a first block, block A 320, of the second parallel compare logic unit 316 compares the second lookup key, $K_2$ 318, to the first entry 302 of the common memory module during the first memory operation cycle, and in that same first memory operation cycle, a second block, block B 322, of the second parallel compare logic unit 316 compares the second lookup key, $K_2$ 318, to the second entry 304 of the common memory module.

The outputs of the parallel compare logic units and their component blocks may take a variety of forms. In one embodiment, each block 312, 314 of a parallel compare logic unit 306 is configured to output a logic 1 if a received lookup key matches the common memory stored entry that is input into that block. The outputs of the blocks 312, 314 of that parallel compare logic unit 306 are then processed by an "or" module that outputs a logic 1 when one or more of the blocks 312, 314 indicate a match, signaling that the common memory includes at least one entry that matches the received lookup key. In another embodiment, the outputs of the blocks 312, 314 of the parallel compare logic unit 306 are summed to output a total number of matches found in the content addressable memory. In a further embodiment, each block 312, 314 of a parallel compare logic unit 306 outputs a data value in response to a received lookup key matching a common memory stored entry that is input into that block. For example, in one embodiment, the data is indicative of an address of the common memory stored entry that was matched by the received lookup key.

The data in the entries 302, 304 of the common memory can take a variety of forms. For example, in one embodiment of the disclosure, a single received lookup key is capable of matching multiple entries in the content addressable memory. In one example, the content addressable memory includes duplicate entries, such that a single received lookup key matches each of those duplicate entries. In another example, certain bits of one or more entries are "do not care" bits that do not need to be matched for a match to be determined between the received lookup key and that common memory stored entry. Such an implementation may be included in a ternary content addressable memory (TCAM), as described further herein with respect to FIGS. 6-7, in contrast to the binary content addressable memories (BCAM) discussed in the preceding examples.

When multiple common memory module entries are matched by a single received lookup key, a content addressable memory and/or related hardware or software can be configured to select a subset of those matched entries (e.g., one entry) of which to output or upon which to act. For example, in an embodiment, the content addressable memory includes a priority encoder and is configured, despite matches between a lookup key and plural entries stored in the common memory, to output only a single address of a matched common memory stored entry based on a predetermined priority among various matching entries. In another example, the content addressable memory is configured to output or take an action based upon a single address of a matched common memory stored entry that has a highest predetermined priority level.

Figure 4:
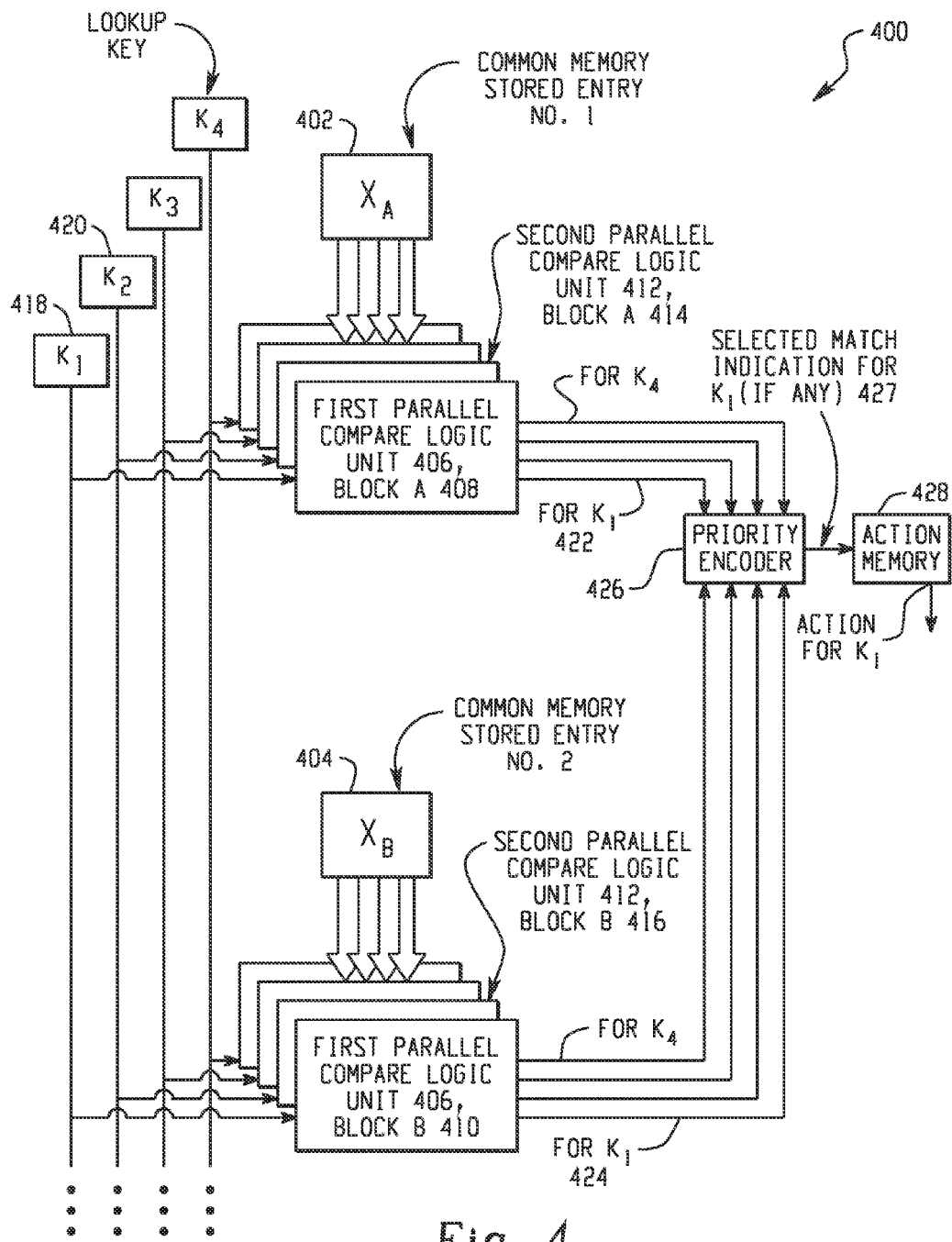
FIG. 4 is a block diagram depicting a content addressable memory that includes a priority encoder and an action memory.

FIG. 4 is a block diagram depicting a content addressable memory 400 that includes a priority encoder and an action memory, in accordance with an embodiment. A common memory includes a plurality of stored entries 402, 404 against which lookup keys are to be compared. In an embodiment, the common memory stored entries 402, 404 are representative of network addresses, where lookup keys corresponding to network addresses extracted from data packets are provided to the content addressable memory in a process of making forwarding decisions for forwarding packet data in a computer network. Each of the common memory stored entries 402, 404 provides data to respective blocks of parallel compare logic units, such as the first parallel compare logic unit 406 that comprises block A 408 and block B 410. Similarly, a second parallel compare logic unit 412 includes block A 414 and block B 416. The multiple parallel compare logic units 406, 412 enable multiple lookup keys, such as $K_1$ 418 and $K_2$ 420 to be received by the content addressable memory 400 and compared to the common memory stored entries 402, 404 at the same time, such as within the same memory operation cycle.

Upon comparing a lookup key to a common memory stored entry, a parallel compare logic unit block outputs a match indication. In one embodiment, the match indication is indicative of an address of the matched common memory stored entry when a match is determined and a 0 or null value otherwise. For example, when lookup key $K_1$ 418 is provided to first parallel compare logic unit 406, block A 408, and a match is determined with common memory stored entry number 1 402, the address of common memory stored entry 1 402 is output as a match indication at 422. When lookup key $K_1$ 418 is provided to first parallel compare logic unit 406, block B 410, and a match is determined with common memory stored entry number 2 404, the address of common memory stored entry 2 404 is output as a match indication at 424.

As noted above, it is possible for a received lookup key to match multiple common memory stored entries. In certain embodiments, the content addressable memory 400 is configured to output only a single value or instruct that a single action be performed, despite the received lookup key matching multiple entries. In one embodiment, such a conflict created by the multiple matches is managed by a priority encoder 426. The priority encoder 426 is configured to receive one or more match indications 422, 424 from a parallel compare logic unit 406 for a lookup key 418, such as during the same memory operation cycle that the lookup key 418 is compared to the common memory stored entries 402, 404. The priority encoder is configured to select one of those match indications 422, 424 based on a selection rule, such as one of a plurality of selection rules stored in a memory of the priority encoder 426, during the memory operation cycle.

In one embodiment, the match indication 427 selected by the priority encoder 426, or a representation thereof, is output from the priority encoder 426 as an output of the content addressable memory 400. In another embodiment, the output 427 of the priority encoder 426 is provided to an action memory 428. The action memory 428 includes a memory that stores a plurality of actions that are to be taken based on an input 427 received from the priority encoder 426. For example, in one embodiment, the action memory 428, which can be any suitable memory such as a DRAM memory for example, includes tables used to make forwarding decisions for forwarding packet data sent over a computer network. Packet data is received from a computer network. Various information is extracted from the data packets and is then subsequently used to construct a lookup key. The lookup key is compared against the common memory stored entries of a CAM memory, such as entries 402, 404, to determine whether the content addressable memory 400 contains one or more entries that match the lookup key. Matching entries are provided to priority encoder 426 which in turn selects one of the matching entries according to a predetermined priority, in an embodiment. Upon selection by the priority encoder 426, an indication 427 of the best match is provided to the action memory 428. In an embodiment, a second lookup is performed at the action memory 428, which is for example a DRAM, to determine an action for the matching entry. In an embodiment, the action determined for the matching entry is, for example, a forwarding decision indicative of a port in a network device to which the data packet is to be forwarded.

In one embodiment, multiple priority encoders 426 may be implemented, where one priority encoder 426 is implemented for each parallel compare logic unit 406, 412. In such a configuration, a match indication 422 for a lookup key 418 that is provided to a particular parallel compare logic unit 406 will be directed to a particular one of the multiple priority encoders 406.

Figure 5:
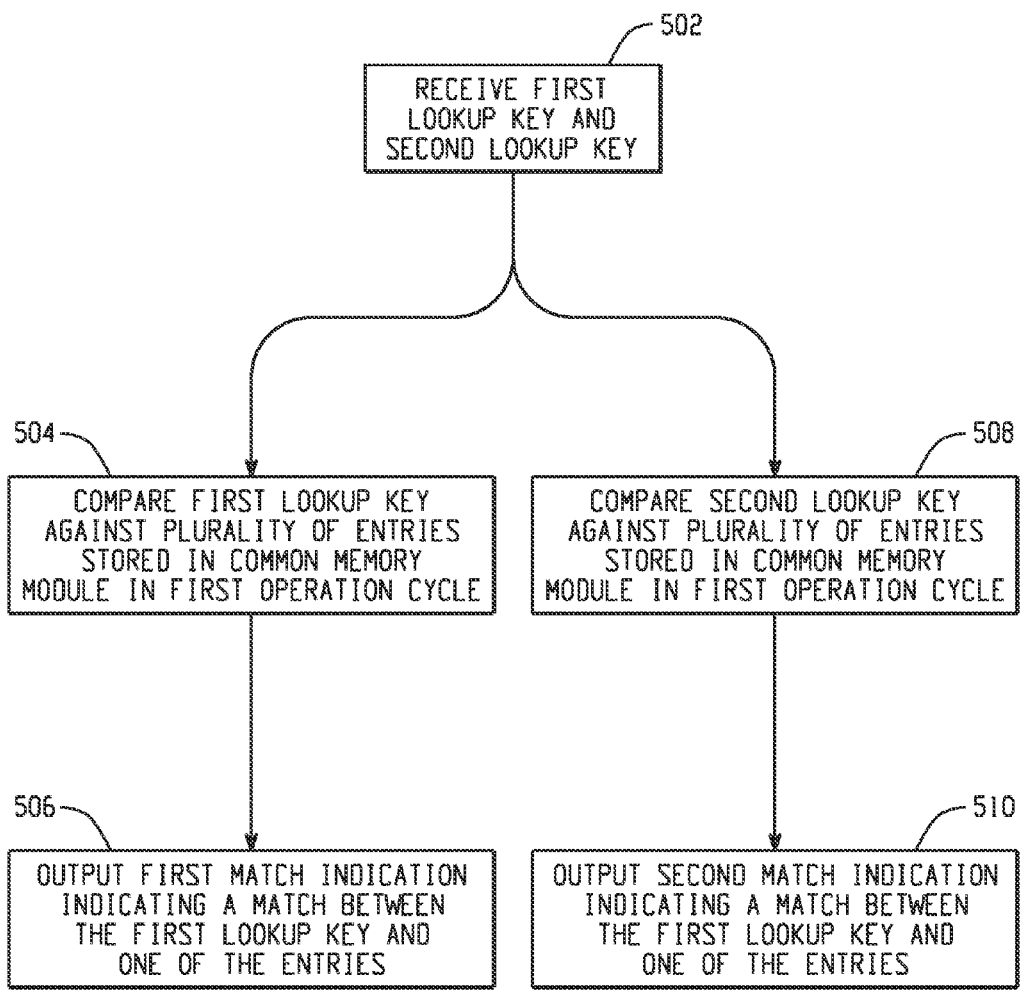
FIG. 5 is a flow diagram depicting a method of simultaneously comparing multiple lookup keys with multiple stored key memory entries.

FIG. 5 is a flow diagram depicting a method of simultaneously comparing multiple lookup keys with multiple stored key memory entries. At 502, a first lookup key and a second lookup key are received. The first lookup key and the second lookup key are compared to multiple common memory module stored entries in parallel during a first memory operation cycle. At 504, the first lookup key is compared against a plurality of entries stored in the common memory module in the first memory operation cycle. At 506, a match indication is output that indicates a match between the first lookup key and one of the entries stored in the common memory module. Also during the first memory operation cycle, at 508, the second lookup key is compared against the plurality of entries stored in the common memory module in parallel with the comparing of the first lookup key at 504. At 510, a second match indication is outputted indicating a match between the second lookup key and one of the entries.

Figure 6:
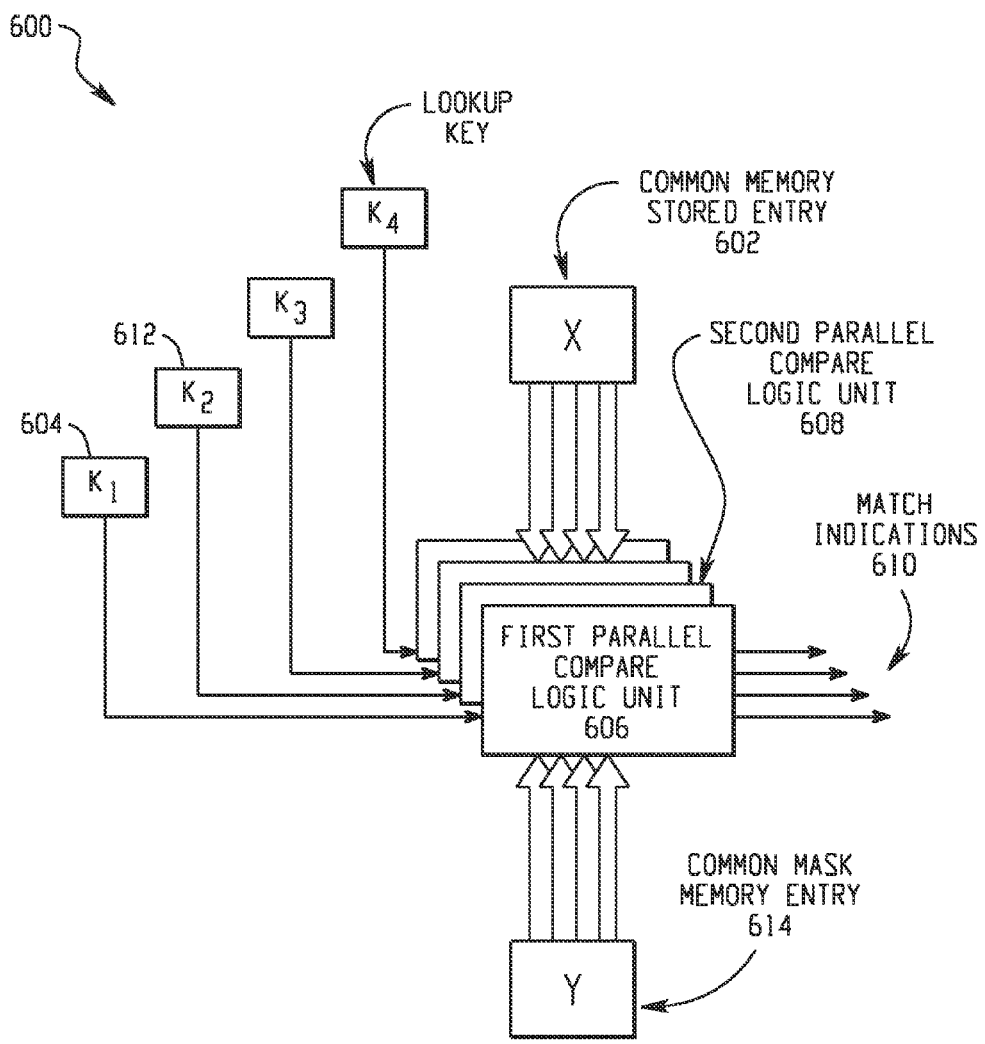
FIG. 6 is a block diagram depicting a ternary content addressable memory that includes a parallel compare logic unit.

FIG. 6 is a block diagram depicting a ternary content addressable memory that includes a parallel compare logic unit. The content addressable memory 600 includes an entry 602 of a common memory module. The entry 602 includes a string of bits. When the content addressable memory 600 receives a lookup key, such as lookup key $K_1$ 604, the lookup key 604 is compared to the entry 602 of the common memory module to determine if the lookup key 604 matches the entry 602 of the common memory module.

The content addressable memory 600 includes multiple parallel compare logic units 606, 608 that enable comparisons to be performed between the entry 602 of the common memory module and multiple lookup keys 604, 612 at the same time. For example, a first parallel compare logic unit 606 compares the entry 602 to a first received lookup key, $K_1$ 604, during a first memory operation cycle. The first parallel compare logic unit 606 outputs a result of that comparison in the form of a match indication 610 during the first memory operation cycle.

When a second lookup key, $K_2$ 612, is received by the content addressable memory 600 at or near the same time that the first lookup key, $K_1$ 604, is received, the second lookup key, $K_2$ 612, is provided to a second parallel compare logic unit 608. The second parallel compare logic unit 608 compares the entry 602 to the second lookup key, $K_2$ 612, and outputs a match indication 610 for the second lookup key, $K_2$ 612, during the first memory operation cycle.

In the embodiment of FIG. 6, the content addressable memory 602 further includes a common mask memory entry 614 that identifies certain bits of the common memory stored entry 602 that are "do not care" bits, which do not need to be matched by a received lookup key for a match to be determined and an indication of a match to be output at 610. Such a configuration is useful in a variety of contexts, including in the transmission of network data. In an embodiment, received lookup keys are indicative of a destination or intermediate addresses for the transmission of network data. Certain portions of a network address can be indicative of a particular server or local network to which the network data is destined (for instance, certain octets of an Internet Protocol (IP) address), and other portions of the network address are indicative of a particular destination within the local network or server. When the content addressable memory 600 is positioned for trans-network routing, the portions of the network address indicative of a local destination are not relevant in routing the network data. Thus, the local destination bits of the lookup key are ignored by marking those bits as "do not care" bits using the common mask memory entry 614. Conversely, when the content addressable memory is positioned for intra-network routing, such as once the network data has been received from an outside network, the portions of the network address indicative of a trans-network destination are no longer relevant in routing the network data. Thus, the trans-network destination bits of the lookup key are ignored by marking those bits as "do not care" bits using the common mask memory entry 614.

In another embodiment, received lookup keys are indicative of various source and destination MAC addresses, source IP, destination IP and other information, ports, etc. The lookup is used, for example, to associate a packet with a particular flow of packets. Certain portions of the lookup key may not be relevant to the current data transporting operation of interest. Thus, bits of the lookup key associated with those irrelevant portions may be masked by the common mask memory entry 614.

Figure 7:
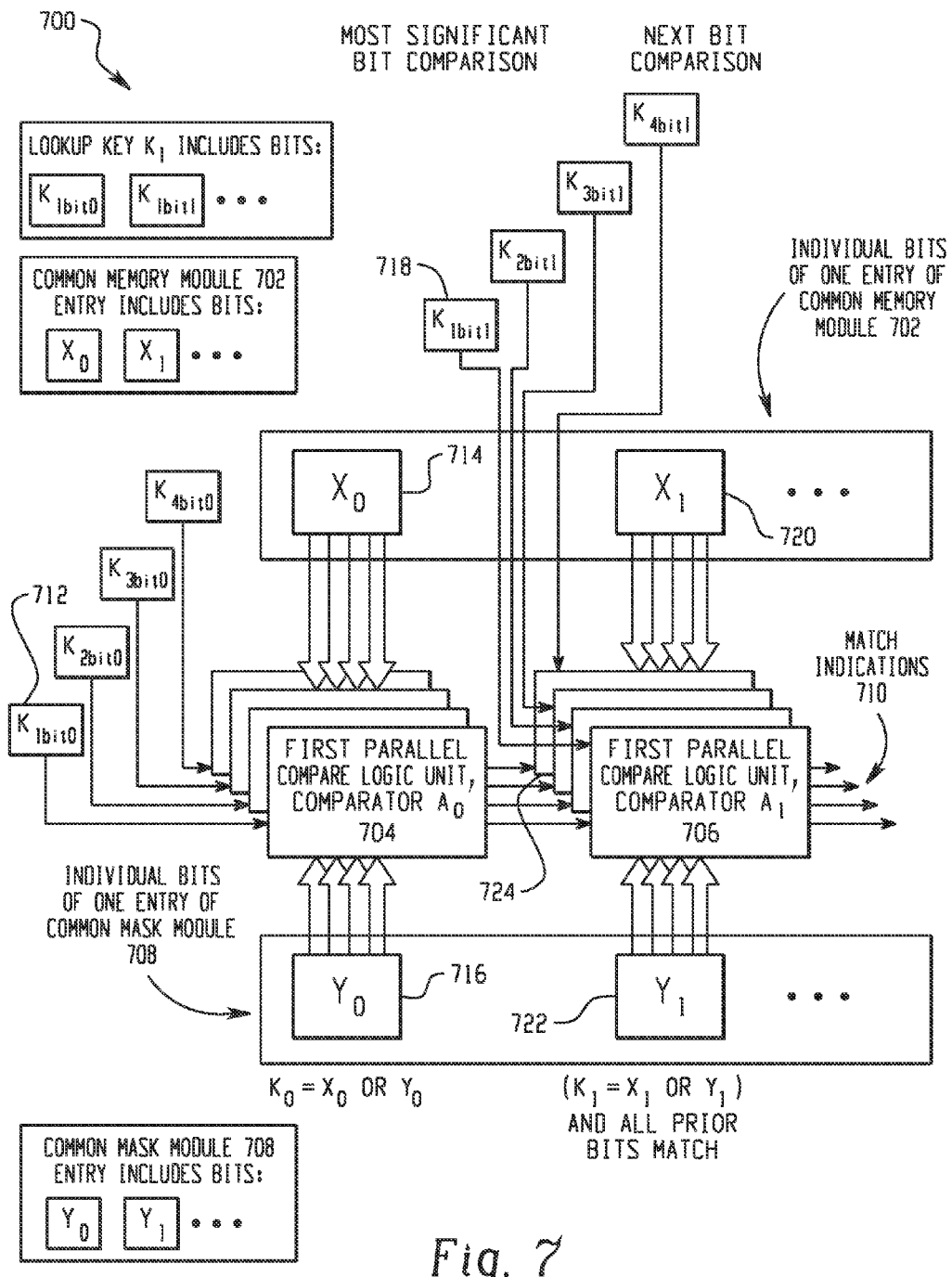
FIG. 7 is a block diagram depicting further details of the ternary content addressable memory of FIG. 6 in one embodiment.

FIG. 7 is a block diagram depicting further details of the ternary content addressable memory 700 of FIG. 6 in one embodiment. The diagram of FIG. 7 illustrates a bit-wise comparison between the received lookup keys, $K_1$, $K_2$, $K_3$, $K_4$, and the entry of the common memory module 702. In the embodiment of FIG. 7, each of the parallel compare logic units, A, B, C, and D, includes a plurality of bit comparators. For example, the first parallel compare logic unit, A, includes a first comparator $A_0$ 704 and a second comparator $A_1$ 706. Each comparator determines whether a specific bit of a received lookup key matches a specific bit of the common memory module entry 702, subject to any "do not care" bits identified by the common mask module entry 708. When all of the bits of the lookup key match all of the bits of the common memory module entry 702 that are not identified as "do not care" bits by the common mask module 708, a match indication 710 is output.

In the embodiment of FIG. 7, the comparison is accomplished via a cascading implementation of the bit comparators 704, 706. For example, when the $K_1$ lookup key is received, a first, most significant bit 712 of the $K_1$ lookup key is provided to the first bit comparator 704 of the first parallel compare logic unit, A. That first bit comparator 704 compares the first bit 714 of the common memory module entry 702 with the most significant bit 712 of the $K_1$ lookup key subject to the first bit 716 of the common mask module, where a true or "1" value at 716 indicates that the first bit 714 of the common memory module entry 702 is a "do not care" bit. Specifically, the first bit comparator 704 determines whether $K_{1bit0}=X_0$ or $Y_0=1$, and outputs a bit match indication at 724. The second bit comparator 706 compares the second bit 718 of the $K_1$ lookup key with the second bit 720 of the entry 702 subject to the second bit 722 of the common mask module and the result 724 from the first bit comparator 704. The second bit comparator 706 outputs an indication of a match at 710 when ($K_{1bit1}=X_1$ or $Y_1=1$) and when the match indication 724 from the first bit comparator 704 indicates that the most significant bits also matched. If the common memory module entry 702 and lookup keys comprise more than two bits, then the match indication output at 710 is provided to further bit comparators. If the common memory module entry 702 consists of only two bits, then the match indication 710 indicates whether all of the bits the common memory module entry 702 match all of the bits of the lookup key, $K_1$, that are not identified as "do not care" bits. In addition to the cascading implementation of the bit comparisons described with respect FIG. 7, other configurations may also be implemented, such as the parallel bit comparison described herein above with respect to FIG. 2.

Figure 8A:
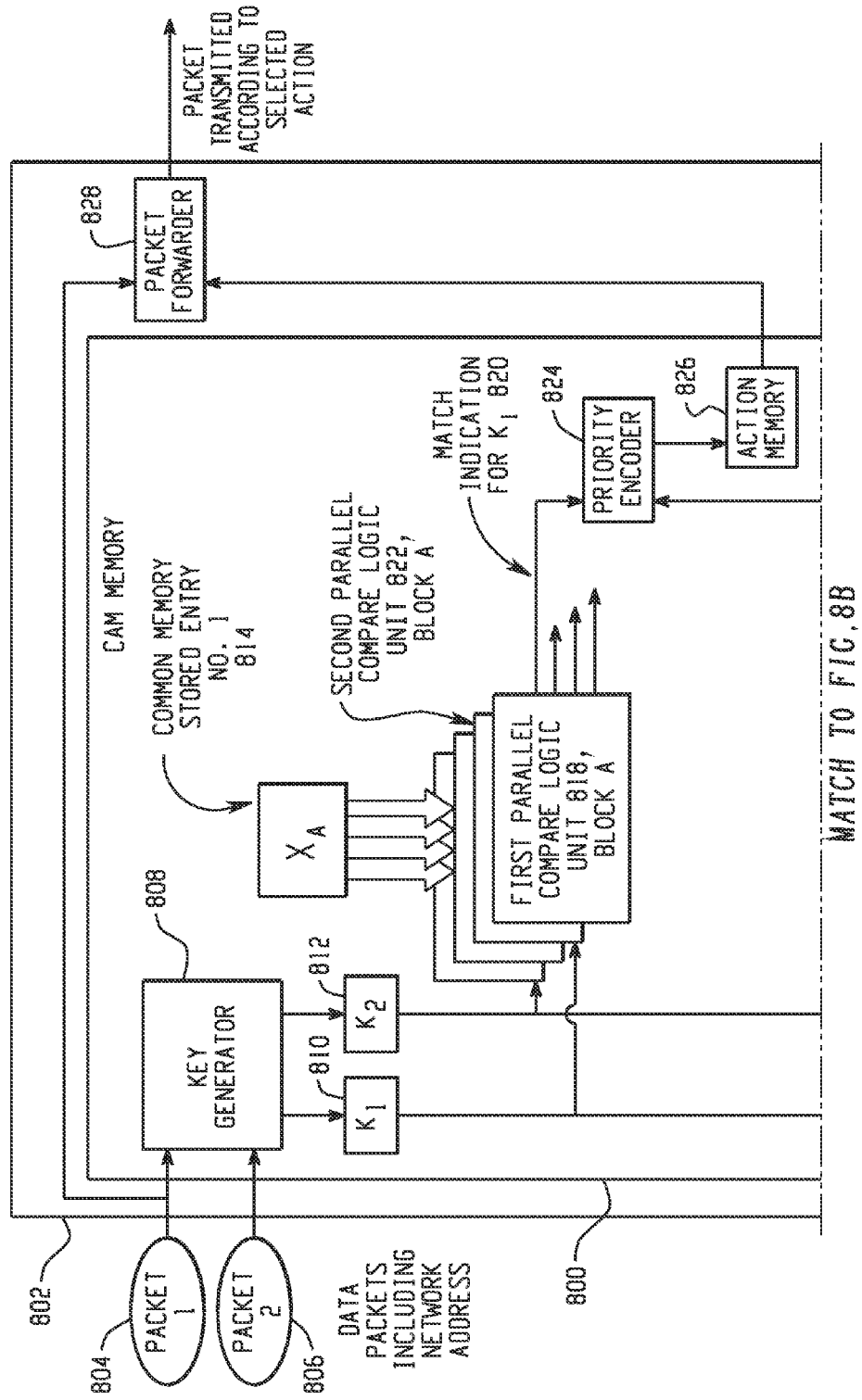
FIGS. 8A and 8B are a block diagram depicting a content addressable memory that is implemented as a component of a network device.
Figure 8B:
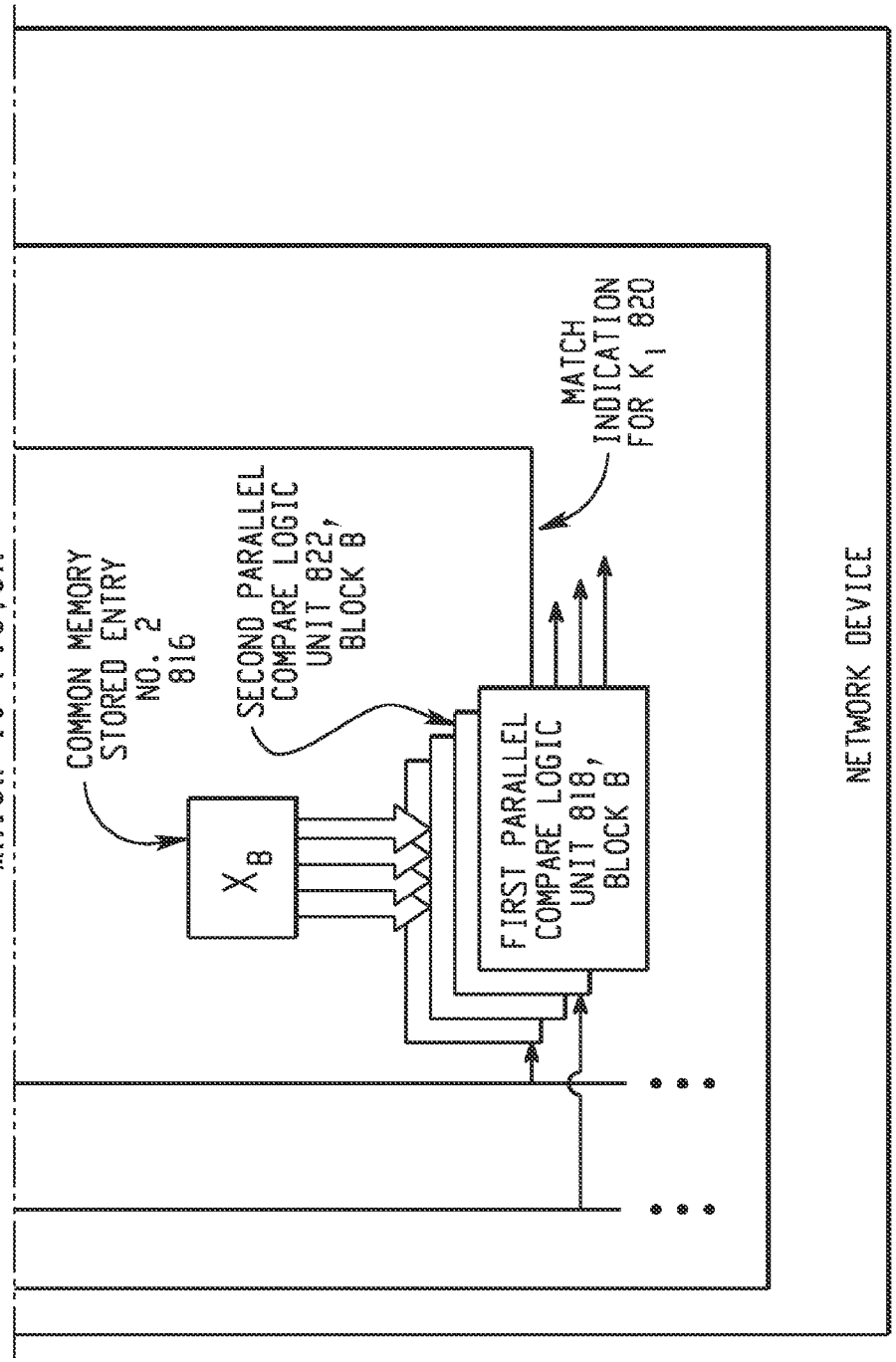

A content addressable memory, as described by the examples herein, can be implemented in a variety of systems designed for a variety of applications. FIGS. 8A and 8B are a block diagram depicting an embodiment, where a content addressable memory 800 is implemented as a component of a network device 802, such as a switch, router, bridge or other suitable device. The network device 802 is configured to receive a first packet of data 804 having one or more first characteristics, such as respective first source and destination addresses, and a second packet of data 806 having one or more second characteristics, such as second source and destination addresses. The respective first and second characteristics are not know upon receipt and for any given packet may be partly or wholly the same, or different, from the characteristics of any other received packet. The packets can be received from multiple different devices of disparate types, such as from personal computers, servers, and other network devices. A key generator 808 is configured to generate a first lookup key 810 based on the first network address and to generate a second lookup key 812 based on the second network address. A common stored key memory is configured to store a plurality of entries 814, 816. A first parallel compare logic unit 818 is configured to compare the first lookup key, $K_1$ 810, against the plurality of entries 814, 816 stored in the common memory module in a first operation cycle and to output a match indication 820 indicating a match between the first lookup key and the string of bits of an entry from among the plurality of entries. A second parallel compare logic unit 822 is configured to compare the second lookup key, $K_2$ 812, against the plurality of entries 814, 816 stored in the common memory module in the first operation cycle and to output a match indication indicating a match between the second lookup key and the string of bits of an entry from among the plurality of entries.

In an embodiment, the content addressable memory 800 further includes a priority encoder 824. The priority encoder 824 is configured to receive one or more match indications 820 from the first parallel compare logic unit 818 and to select one of those match indications based on a selection rule in the first operation cycle. In an embodiment, the priority encoder 824 is also configured to receive one or more match indications from the second parallel compare logic unit 822 and to select one of those match indications based on a selection rule in the first operation cycle. In an embodiment, the content addressable memory 800 further includes an action memory 826. The action memory 826 is configured to store routing actions to be taken. The action memory 826 is further configured to output, in the first operation cycle, a first action to be taken based on the selected match indication selected by the priority encoder 824. A packet forwarder 828 receives the data packets 804, 806 and the actions identified by the action memory 826 and forwards the data packets 804, 806 accordingly.

This application uses examples to illustrate the invention. The patentable scope of the invention may include other examples. For example, a network device may utilize a ternary content addressable, such as the ternary content addressable memories described in FIGS. 6 and 7 in place of the content addressable memory depicted in FIGS. 8A and 8B, as well as other examples.

What is claimed is:

1. A content addressable memory, comprising:
   a hardware-implemented common memory module configured to store a plurality of entries, an entry being defined by a string of bits, the memory module being common to a plurality of parallel compare logic units;
   a first parallel compare logic unit configured to compare a first lookup key against the plurality of entries stored in the memory module in a first memory operation cycle, and to output a first match indication indicating a match between the first lookup key and at least a string of bits defining a first one of the entries from among the plurality of entries matching the first lookup key, wherein the first parallel compare logic unit includes a first block and a second block, the first block being configured to compare the first lookup key to a first entry of the memory module in the first memory operation cycle, and the second block being configured to compare the first lookup key to a second entry of the memory module in the first memory operation cycle; and
   a second parallel compare logic unit configured to compare, in the first memory operation cycle and in parallel with the comparing of the first lookup key against the plurality of entries, a second lookup key against the plurality of entries stored in the memory module, and to output a second match indication indicating a match between the second lookup key and at least a string of bits defining a second one of the entries from among the plurality of entries matching the second lookup key, wherein the second lookup key is different than the first lookup key, and wherein the second parallel compare logic unit includes a third block and a fourth block, the third block being configured to compare the second lookup key to the first entry of the memory module in the first memory operation cycle, and the fourth block being configured to compare the second lookup key to the second entry of the memory module in the first memory operation cycle.

2. The memory of claim 1, further comprising a key generator, the key generator being configured generate the first lookup key based on a first received data communications packet that is received at a network device, and the key generator being configured to generate the second lookup key based on a second received data communications packet that is received at the network device.

3. The memory of claim 1, wherein the first block includes a first bit comparator and a second bit comparator, wherein the first bit comparator is configured to compare a first bit of the first lookup key to a first bit of the first entry, and wherein the second bit comparator is configured to compare a second bit of the first lookup key to a second bit of the first entry.

4. The memory of claim 1, further comprising:
   a priority encoder, wherein the priority encoder is configured to receive one or more match indications from the first parallel compare logic unit and to select one of those match indications based on a selection rule in the first memory operation cycle, and wherein the priority encoder is configured to receive one or more match indications from the second parallel compare logic unit and to select one of those match indications based on the selection rule in the first memory operation cycle.

5. The memory of claim 4, further comprising:
   an action memory, wherein the action memory stores actions to be taken, wherein the action memory is configured to output a first action based on the selected match indication for the first parallel compare logic unit and a second action based on the selected match indication for the second parallel compare logic unit in the first operation cycle.

6. The memory of claim 1, further comprising:
a mask memory configured to store a plurality of mask values, wherein each of the mask values is associated with one of the entries, and wherein each of the mask values identifies one or more bits of the associated entry that do not need to be matched for the match indication to be output.

7. The memory of claim 1, wherein the content addressable memory is a binary content addressable memory (BCAM) or a ternary content addressable memory (TCAM).

8. The memory of claim 1, wherein the first lookup key is received from a first device of a first type, and wherein the second lookup key is received from a second device of a second type.

9. The content addressable memory of claim 1, wherein the parallel comparing of the first and second lookup keys against the plurality of entries occurs based on the second lookup key being received by the content addressable memory at the same time that the first lookup key is received by the content addressable memory.

10. A method of simultaneously comparing multiple lookup keys with multiple stored key memory entries, comprising:
receiving a first lookup key;
comparing the first lookup key against a plurality of entries stored in a memory module in a first operation cycle, wherein the comparing of the first lookup key against the plurality of entries includes (i) comparing the first lookup key to a first entry of the memory module in the first operation cycle, and (ii) comparing the first lookup key to a second entry of the memory module in the first operation cycle;
outputting a first match indication indicating a match between the first lookup key and one of the entries;
receiving a second lookup key that is different than the first lookup key;
comparing the second lookup key against the plurality of entries stored in the memory module in the first operation cycle in parallel with the comparing of the first lookup key, wherein the comparing of the second lookup key against the plurality of entries includes (i) comparing the second lookup key to the first entry of the memory module in the first operation cycle, and (ii) comparing the second lookup key to the second entry of the memory module in the first memory operation cycle; and
outputting a second match indication indicating a match between the second lookup key and one of the entries.

11. The method of claim 10, further comprising:
generating the first lookup key based on a first received data communications packet that is received at a network device; and
generating the second lookup key based on a second received data communications packet that is received at the network device.

12. The method of claim 10, further comprising:
ignoring one or more bits of a particular one of the entries when performing the comparison of the first lookup key based on a mask memory.

13. The method of claim 10, further comprising:
when multiple first match indications are outputted, selecting one of those match indications based on a selection rule in the first operation cycle.

14. The method of claim 13, further comprising:
outputting a first action based on the selected match indication.

15. The method of claim 10, wherein the parallel comparing of the first and second lookup keys against the plurality of entries occurs based on the first and second lookup keys being received at the same time.

16. A computer network device, comprising:
a receiver configured to receive a first packet of data associated with a first network address and a second packet of data associated with a second network address;
a key generator configured to generate a first lookup key based on the first network address and to generate a second lookup key based on the second network address, the first lookup key being different than the second lookup key; and
a content addressable memory comprising:
a hardware-implemented common stored key memory module configured to store a plurality of entries, the stored key memory module being common to a plurality of parallel compare logic units,
a first parallel compare logic unit configured to compare the first lookup key associated with the first network address against the plurality of entries stored in the memory module in a first memory operation cycle, and to output a first match indication indicating a match between the first lookup key and at least a string of bits defining a first one of the entries from among the plurality of entries, wherein the first parallel compare logic unit includes a first block and a second block, the first block being configured to compare the first lookup key to a first entry of the memory module in the first memory operation cycle, and the second block being configured to compare the first lookup key to a second entry of the memory module in the first memory operation cycle, and
a second parallel compare logic unit configured to compare, in the first memory operation cycle and in parallel with the comparing of the first lookup key against the plurality of entries, the second lookup key associated with the second network address against the plurality of entries stored in the memory module, and to output a second match indication indicating a match between the second lookup key and at least a string of bits defining a second one of the entries from among the plurality of entries, wherein the second parallel compare logic unit includes a third block and a fourth block, the third block being configured to compare the second lookup key to the first entry of the memory module in the first memory operation cycle, and the fourth block being configured to compare the second lookup key to the second entry of the memory module in the first memory operation cycle.

17. The network device of claim 16, further comprising:
a priority encoder, wherein the priority encoder is configured to receive one or more match indications from the first parallel compare logic unit and to select one of those match indications based on a selection rule in the first operation cycle, and wherein the priority encoder is configured to receive one or more match indications from the second parallel compare logic unit and to select one of those match indications based on the selection rule in the first operation cycle.

18. The network device of claim 17, further comprising:

an action memory, the action memory storing routing actions to be taken, wherein the action memory is configured to output, in the first operation cycle, a first action based on the selected match indication for routing the first packet of data.

19. The network device of claim 16, further comprising:

a mask memory configured to store a plurality of mask values, wherein each of the mask values is associated with one of the entries, and wherein each of the mask values identifies one or more bits of the associated entry that do not need to be matched for the match indication to be output.

20. The network device of claim 16, wherein the network device is one of a switch, a router, or a bridge.

21. The computer network device of claim 16, wherein the parallel comparing of the first and second lookup keys against the plurality of entries occurs based on the second lookup key being received by the content addressable memory at the same time that the first lookup key is received by the content addressable memory.

\* \* \* \* \*